United States Patent
Van Acht et al.

(10) Patent No.: US 7,579,968 B2
(45) Date of Patent: Aug. 25, 2009

(54) ENCODING OF DATA WORDS USING THREE OR MORE LEVEL LEVELS

(75) Inventors: Victor M. G. Van Acht, Waalre (NL); Nicolaas Lambert, Waalre (NL); Sebastian Egner, Eindhoven (NL); Hans M. B. Boeve, Belgium (BE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 11/572,807

(22) PCT Filed: Jul. 19, 2005

(86) PCT No.: PCT/IB2005/052398

§ 371 (c)(1), (2), (4) Date: Aug. 13, 2008

(87) PCT Pub. No.: WO2006/013496

PCT Pub. Date: Feb. 9, 2006

(65) Prior Publication Data

US 2008/0316070 A1    Dec. 25, 2008

(30) Foreign Application Priority Data

Jul. 27, 2004    (EP) .................................. 04103588

(51) Int. Cl.
    *H03M 5/02* (2006.01)
(52) U.S. Cl. .......................................... 341/56; 341/57
(58) Field of Classification Search .................... 341/56, 341/57, 68, 69, 53; 714/752; 370/204
See application file for complete search history.

(56) References Cited

U.S. PATENT DOCUMENTS

| | | | | |
|---|---|---|---|---|
| 4,309,694 | A | | 1/1982 | Henry |
| 5,166,956 | A | * | 11/1992 | Baltus et al. ................. 375/286 |
| 5,659,579 | A | * | 8/1997 | Herzberg ..................... 375/262 |
| 6,148,428 | A | * | 11/2000 | Welch et al. ................. 714/752 |
| 6,640,015 | B1 | * | 10/2003 | Lafruit et al. ............... 382/260 |

FOREIGN PATENT DOCUMENTS

EP    0758825 A    2/1997

* cited by examiner

*Primary Examiner*—Brian Young

(57) ABSTRACT

A data processing circuit comprises an encoder circuit for encoding a data word, wherein each digit may have any one of three or more digit values. The data word is encoded so that digit counts in the data word satisfy predetermined criteria (the digit counts are counts of the numbers of the digits in the encoded data word that assume respective digit values). The encoder defines at least two digit maps, each digit map defining assignments of each of the available digit values to a respective different output digit value. The encoder selects at least two groups of digits within the input data word. Each group is associated with a respective one of the digit maps, the groups being selected so that when each digit map has been applied selectively to the digits from its associated group, digit counts of the number of times respective digit values occur in the data word will satisfy predetermined criteria. A data signal is generated that represents the input data word by information that identifies the selected groups and an output data word obtained by mapping the digits of each group in the input data word according to the digit map for that group.

18 Claims, 5 Drawing Sheets

ENCODING OF DATA WORDS USING THREE OR MORE LEVEL LEVELS

Figure 1:
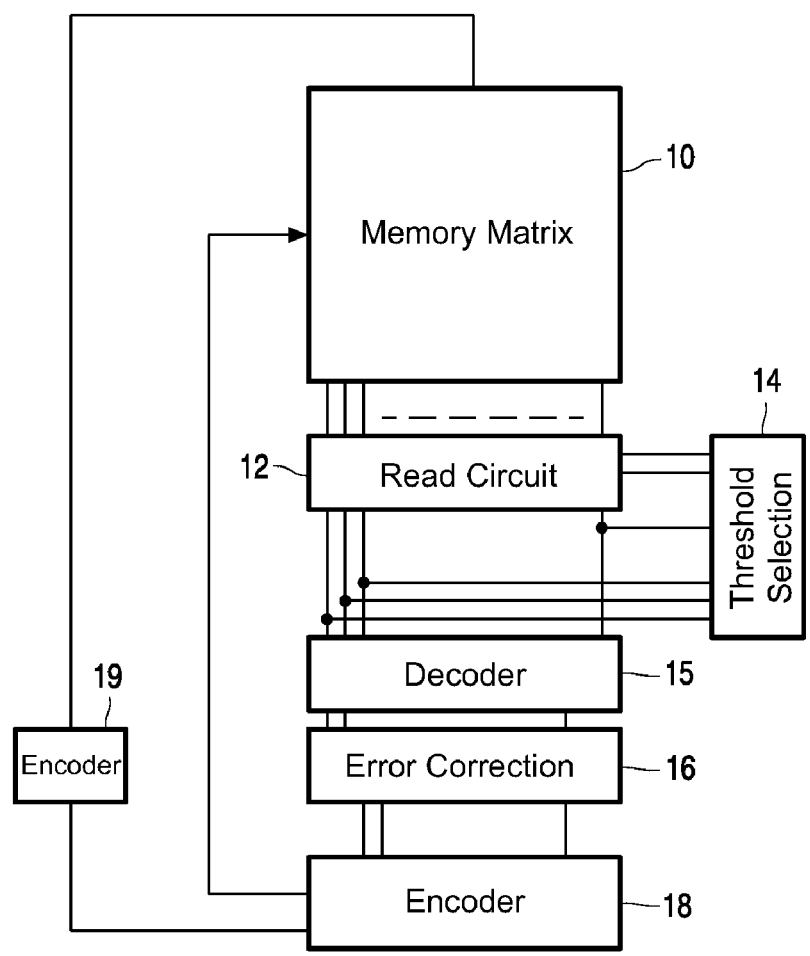

The invention relates to methods of encoding and decoding data words and preferably to an application of these methods to storage of data words in a memory matrix. The invention also relates to a circuit with a memory matrix wherein such encoded words are stored.

U.S. Pat. No. 4,309,694 describes a data transmission technique wherein data is encoded into words of binary bits so that the number of bits in a word with the value of logic one equals the number of bits with the value of logic zero. This is realized by counting a first number of logic ones in an input word and logically inverting a part of the word wherein half the first number of bits has the value of logic one.

The present invention is concerned with so- called multi-level encoding where signal values chosen from more than two signal levels are used to represent digits of more than binary data in a data word.

In a particular embodiment, the present invention is concerned with memory circuits. The capacity of a memory circuit can be increased by using multilevel representation of digits instead of binary representation. In a typical memory data is represented by charge stored in memory cells, for example as charge on a floating gate on or charge on a capacitor. Normally a binary, or two- level, representation is used where the stored charge nominally has one of two values. When a multilevel representation is used in a memory, the charge is programmed to assume one of three or more nominal values. Thus, each charge represents more information than can be represented with a binary representation. For example, if four levels are used each charge represents two bits of information.

When data is read from the memory, a signal is generated that depends on the charge. The signal is compared with a number of thresholds to determine which of the possible nominal charges has been stored. From the result of the comparisons the stored information is reconstructed. The more levels are used, the more digit values can be encoded, but in practice the maximum number of levels is limited by factors such as signal to noise ratio during detection. The use of four levels has been found to be possible in flash memories.

The level of the thresholds is critical for the reliable operation of such a memory and thereby for the maximum number of levels. The threshold levels should distinguish between signal levels for adjacent nominal charges, with a minimum of errors due to unavoidable fluctuations around these signal levels. An additional problem is that the charge levels may exhibit a systematic shift (i.e. a shift that occurs for each charge) as a function of time or circumstances such as temperature.

To account for this type of shift, it is desirable to adapt the threshold levels dynamically. One technique for the selection of the adapted reference levels is to use reference cells that initially store predetermined amounts of charges and to subject the reference cells to the same influences as data cells wherein data is stored. From the output signals derived from these reference cells, adapted threshold may be derived. In this way threshold shifts can be compensated for. However, this method makes the memory vulnerable to faults in the reference cells. In memories like flash memories, wherein the threshold changes depend on the number of times that data is written, the reference cells have to be as many times as data cells, which makes the reference cells vulnerable to faults (faults in data cells can be corrected more easily using an Error Correcting Code).

An attractive alternative is to derive the threshold levels from information obtained from the data cells themselves. Data is stored as data words of multilevel digits (typically occupying the cells of substantially an entire row of a memory matrix). When the count of digits that assume different levels in a data word (called the digit count herein) is known to satisfy certain constraints, e.g. when predetermined numbers of symbols assume respective levels in a data word, the threshold levels can be derived from statistics of the output signals obtained for a data word. When the data word is large this has the advantage that errors in individual cells have little effect on threshold selection.

However, this technique requires that information is encoded only with data words wherein the digit counts satisfy predetermined constraints. When binary representation is used to represent data in the memory, a technique like the one disclosed in U.S. Pat. No. 4,309,694 for transmission purposes may be applied. However, this technique does not address multi- level encoding with three or more level, nor, of course, the application of this type of encoding to threshold selection for use during reading from a memory matrix.

EP 758 825 discloses a method and apparatus for generating channel codewords so that a running digital sum is zero. This document is concerned with binary encoding in multi-bit codewords. Each codeword comprises a plurality of binary symbols, each of which provides its own contribution to the running digital sum. In one embodiment, each possible data word can be encoded by either one of a pair of mutually inverse channel code words. In each pair the digital sum of the symbols of one channel codeword of the pair is minus that of the other channel codeword of the pair. In an alternative embodiment the codewords in the pairs are not each others' inverse but merely have opposite digital sums. During channel encoding data words are received successively and for each data word that one of its pair of channel codewords is selected that keeps the running digital sum closest to zero.

In another embodiment EP 758 825 defines a plurality of different maps of the input data symbols. Each map maps to a different set of channel codewords that all have the same digital sum, the sets of different maps having mutually different digital sums. In this embodiment different ones of these non- overlapping maps are selected in the course of time to keep the running digital sum close to zero.

US 2003/0152154 applies similar techniques to multi-level encoding: each data word can be translated to any one of two channel code words with mutually different sequences of multi- level digits. The different codewords for the same data word have different digital sums (average signal levels). During encoding a selection is made for each successive data word between the corresponding channel codewords, each time to select the codeword that will keep the running digital sum closest to zero. Apart form the fact that both US 2003/0152154 and EP 758 825 use disjoint sets of alternatives for encoding respective data words, both select between one alternative or an another for data words as a whole, each with a fixed plurality of symbols.

US 2002/181278 describes storage in a storage medium wherein multilevel representation of digits is used and wherein it is ensured that more than adjacent symbols are more than one inter- level distance apart.

Among others it is an object of the invention to provide for encoding of greater than two level information so that threshold levels for detecting the information can readily be selected from the encoded information itself.

Among others it is an object of the invention to provide for encoding of greater than two level information so that digit counts in the word meet predetermined criteria.

According to one aspect an input data word is encoded with more than two levels to represent digits in an output data word, by subjecting at least two groups of the digits from the input data word selectively to respective digit maps (i.e. without subjecting digits outside the group to the digits maps, so that for a digit value from the input data word different levels may be used, dependent on whether a digit that has the digit value is in one group or another or outside the groups). Each map determines how each of the levels is associated with digit values in the input data word. A typical example of a digit map includes the exchange of a pair of digit values, leaving the other digit values unchanged.

The digits of the data words that are assigned to different ones of the groups are selected under a constraint that the digit counts for respective digit values after mapping meet predetermined criteria. Typical criteria include that all digit counts have predetermined values, or are within predetermined ranges of values, for example that all digit counts have the same value or are in the same range. An alternative criterion could require that the sum of digit counts for a set of digit values has a predetermined value, or lies within a predetermined range. For any data word there will exist many combinations of groups that satisfy these criteria. Any such combination may be selected.

The contents of the groups are selected so that the criteria are met and information that identifies the groups is included with the information that encodes the data words. Many ways of searching for suitable groups of digits may be used. A simple way would be to consider all possible groups, determine for each combination of groups whether the criteria are met, and to select a combination of groups for which the criteria have been met. However, such a technique is computationally expensive, especially when data words with many digits are used, for example 128 bits or more, 256 or more or even 1024 bits or more per word in which the criteria must be met.

In an embodiment the groups are selected by defining a sequence of criteria that must be satisfied by the digit counts. Each criterion is associated with a digit map for which a group of digits is selected to ensure that the criterion is met. The digit maps are associated with the criteria so that application of the digit map that is associated with a particular criterion does not affect whether the criteria associated with groups that precede the particular criterion in the sequence are satisfied. In this case the content of the groups can be selected successively, so that an increasingly large number of criteria is met, until all criteria are met. This reduces the computational effort needed for selecting the groups.

Preferably, the combination of criteria and digit maps is selected in dependence on the data word that is encoded in a way so that it is ensured in advance that a suitable group can be found. Alternatively, different digit maps may have to be tried out. If a criterion has the form that a digit count or a sum of digit counts is within a predetermined range (or has a predetermined value), the ensured existence of a suitable group can be checked by computing the relevant digit count or sum of digit counts for an empty group (i.e. for the case where no digit is mapped) and for a full group (for the case where all digits of the data word are mapped). If the range between these two computed value overlaps with the predetermined required range it is ensured that a suitable group can be found.

In an embodiment the information that encodes the data word also contains an indication of the digit maps that have been used for the respective groups. For example, if three digit values are used and the digit maps are a first maps wherein a first digit value is exchanged with a second digit value and a second map wherein the second digit value is exchanged with a third digit value, this information could indicate the second digit value.

Figure 2:
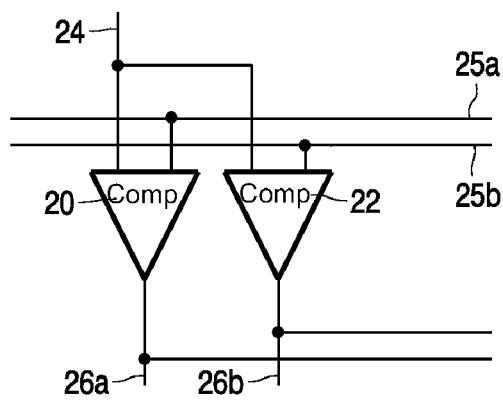
Figure 3:
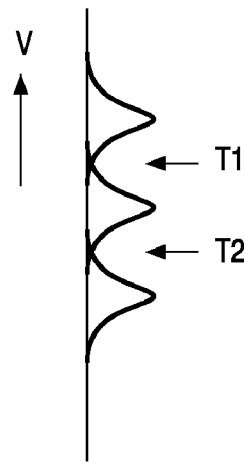
Figure 4:
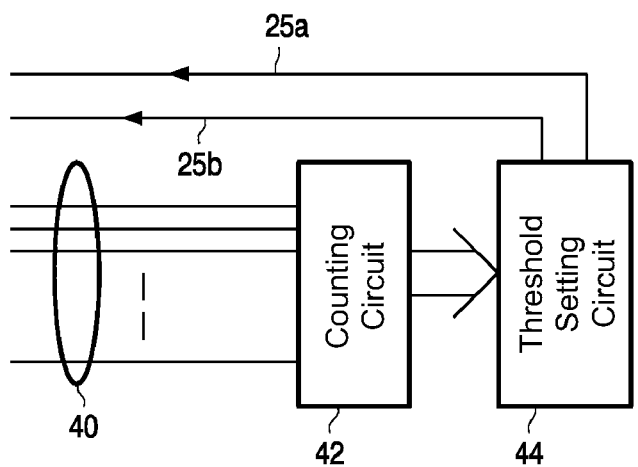
Figure 5:
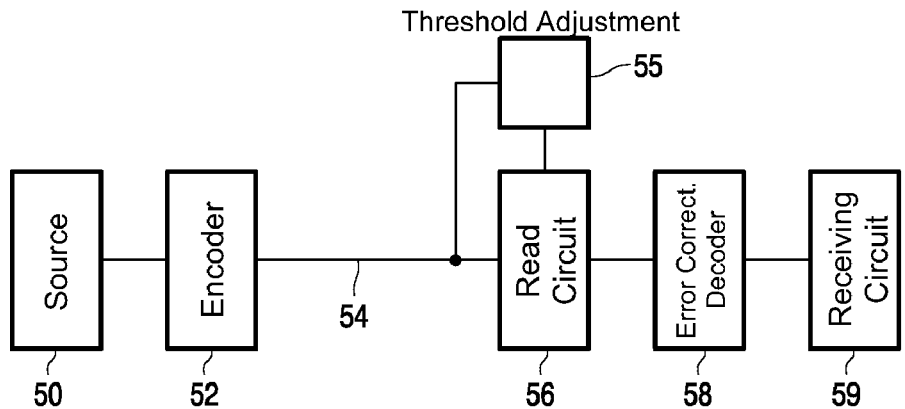
Figure 6:
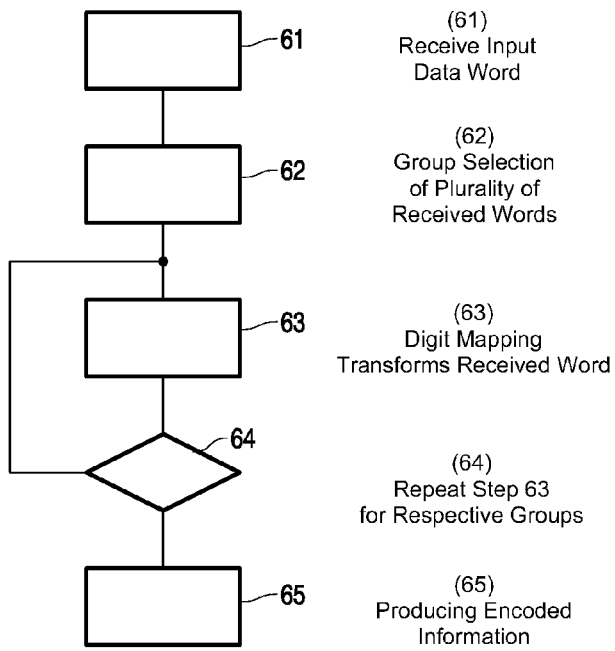
Figure 7:
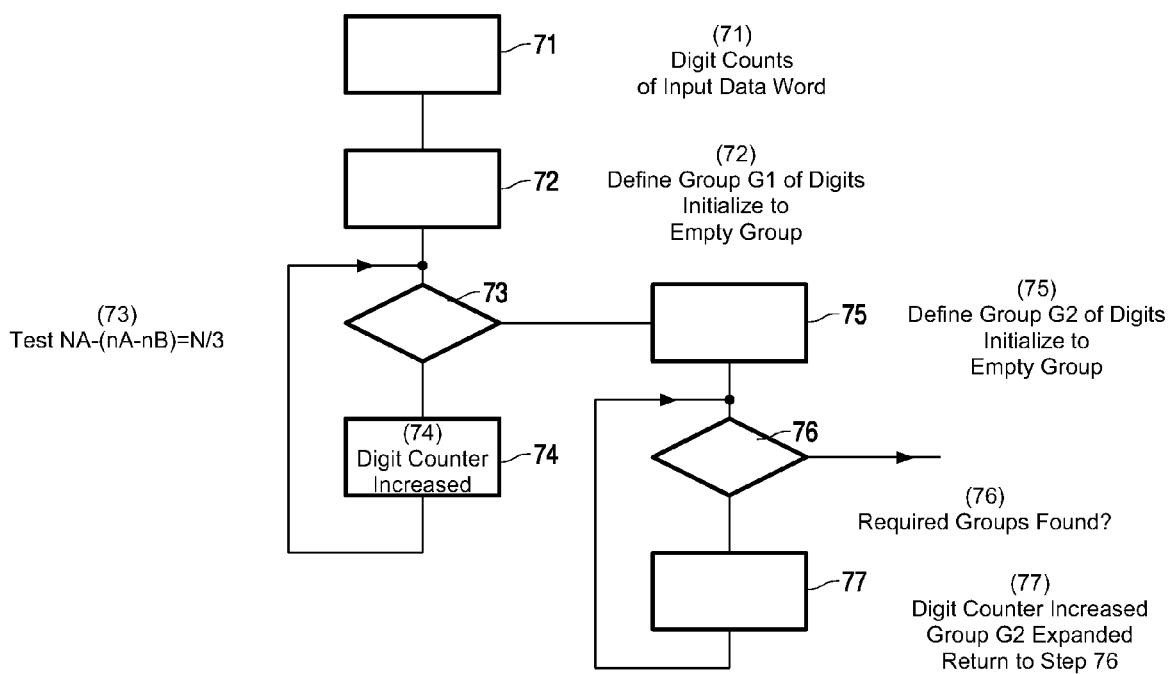
Figure 7A:
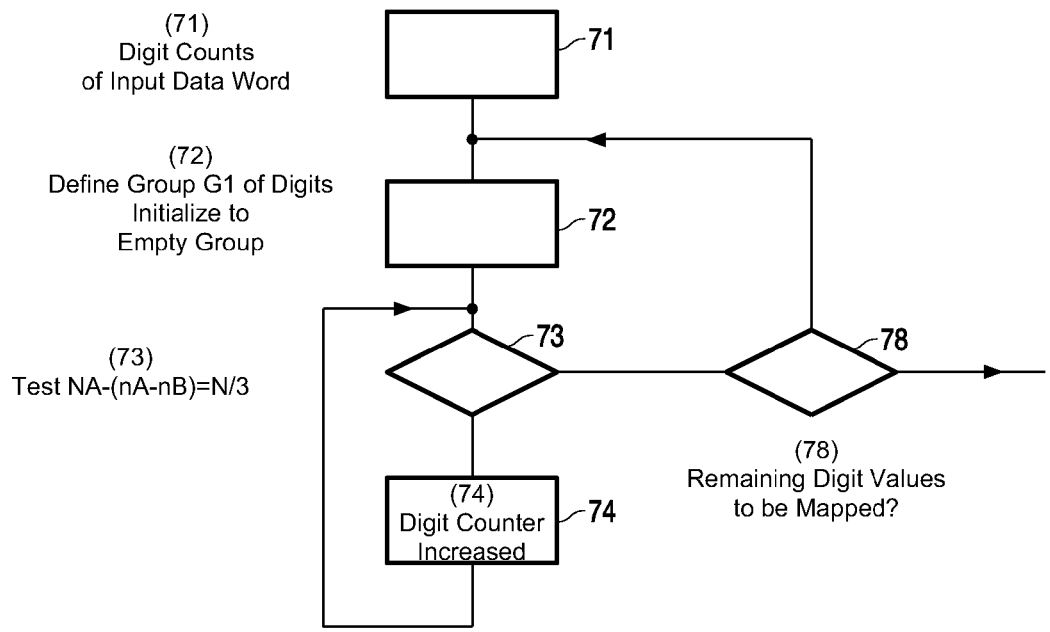
Figure 8:
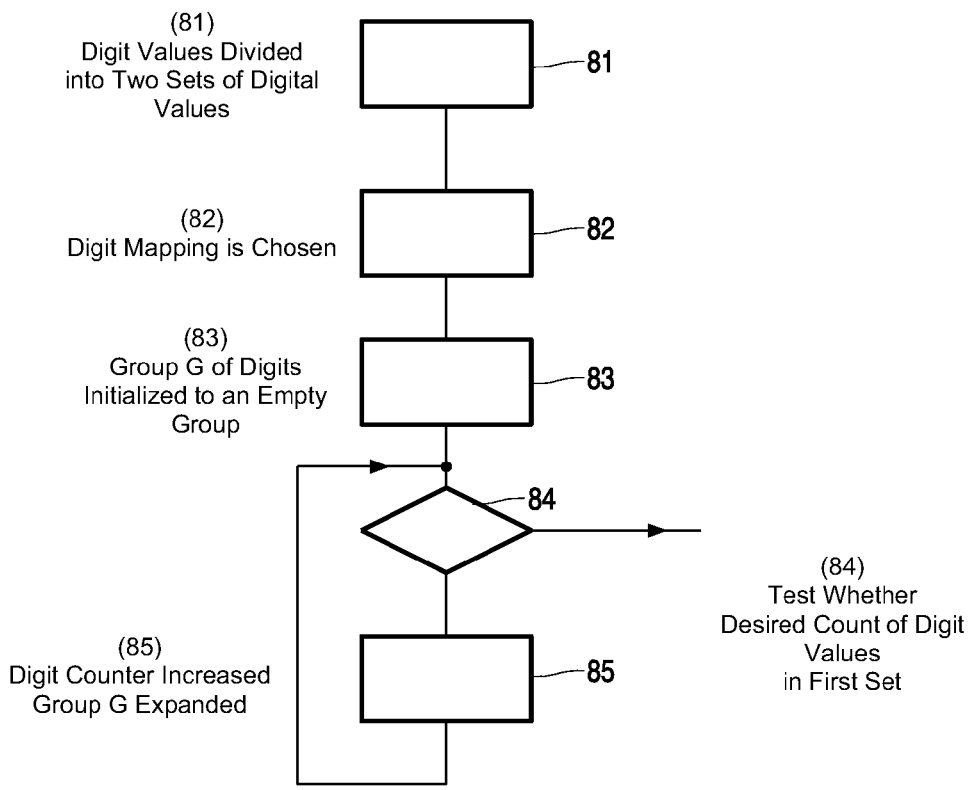
Figure 9:
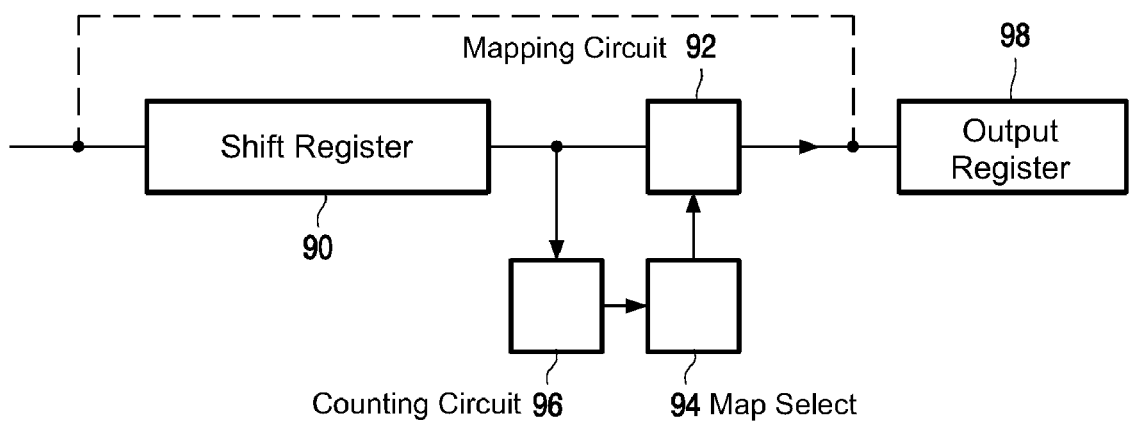

FIG. 1 shows a circuit with a memory matrix
FIG. 2 shows a read circuit
FIG. 3 shows a level distribution
FIG. 4 shows a threshold setting circuit
FIG. 5 shows a transmission circuit
FIG. 6 shows a flow-chart of an encoding process
FIGS. 7, 7a and 8 show flow-charts for selecting groups of digits
FIG. 9 shows a circuit for performing digit mapping The invention is applicable to circuits wherein multilevel (M>2 levels) signals are used to represent digits in multi-digit data words and wherein thresholds to distinguish signal values that represent different digits are selected on the basis of a measure of the respective numbers $N_i$ of digits in a data word that have signal values representing respective digit values. The data words used in such a circuit must satisfy a combination of constraints on the numbers $N_i$ with which the data words are encoded. The invention is concerned with the selection of encoded data words for use in such circuits. To appreciate the invention more fully, an example of a circuit in which the invention can be applied is described first.

1. Example of Circuit with Multi-level Detection

FIG. 1 shows a circuit with a memory matrix 10, a read circuit 12, a threshold selection circuit 14, a decoder 15, an error correction circuit 16, a processing circuit 18 and an encoder circuit 19. Processing circuit 18 has an address output coupled to memory matrix 10. Memory matrix 10 has data signal outputs coupled to read circuit 12. Read circuit 12 has outputs coupled to decoder 15, which has outputs coupled to error correction circuit 16, which in turn has data outputs coupled to processing circuit 18. Furthermore, processing circuit 18 has a write output coupled to memory matrix 10 via encoder 19. The outputs of read circuit 12 are also coupled to threshold selection circuit 14, which has threshold selection outputs coupled to read circuit 12. It should be appreciated that the circuit is shown merely by way of example, for example the error correction circuit 16 may be combined with decoder 15 or omitted, a separate error correcting code encoder may be added between processing circuit 18 and encoder 19, a dedicated addressing circuit may be added that computes addresses separate from processing circuit etc. In operation processing circuit 18 addresses rows of cells (not shown) in memory matrix 10. In response memory matrix 10 outputs signals determined by the information content of the cells on data signal outputs. Read circuit 12 compares these signals with threshold values and outputs results of these comparisons. The results express more than one binary bit of information per data signal output. For example, if three level coding is used, the results express for each data signal level output to which of three nominal levels the signal at the data signal output is assigned. More generally, for example, if M level coding is used, the results express for each data signal level output to which of M nominal levels the signal at the data signal output is assigned. Decoder 15 decodes information from the results and error correction circuit 16 corrects errors in the results. Error correction circuit 16 supplies the decoded and corrected information to processing circuit 18.

FIG. 2 shows an embodiment of part of read circuit 12. A data signal output 24 from memory matrix 10 (not shown) is coupled to inputs of two comparator circuits 20, 22. Further inputs of the comparator circuits 20, 22 are coupled to threshold selection lines 25a,b from threshold selection circuit 14 (not shown). Outputs of comparator circuits 20, 22 are coupled to error correction circuit 16 (not shown). It should be understood that read circuit 12 contains a plurality of circuits of the type shown in FIG. 2, coupled in parallel to respective bit lines 24.

FIG. 3 illustrates the operation of read circuit 12. Each cell in memory matrix 10 is programmed with a data digit so that nominally one of three possible output signals will occur. Due to spread in the values deviations from the nominal values may occur. This is illustrated by plotting the probability with which different output signal values may occur for respective nominal values along a vertical axis. As can be seen there are peaks in the probabilities, corresponding to different nominal values the probabilities drop of from the peaks.

In operation comparator circuits 20, 22 compare the data output signals on the data signal output with respective threshold values $T_i$. Two levels T1, T2 are indicated in FIG. 3. The output signals of comparator circuits 20, 22 classify the data output signal into one of three classes, representing respective digit values. If comparator circuits 20, 22 indicate that the data output signal is below both levels T1, T2 a first digit value is indicated. If comparator circuits 20, 22 indicate that the data output signal is above T2 and below T1 a second digit value is indicated. If comparator circuits 20, 22 indicate that the data output signal is above both T2 and T1 a third digit value is indicated. It will be appreciated that more than three digit values can be accounted for by using more threshold than two levels $T_i$ to distinguish between digits.

The levels $T_i$ must be selected carefully to prevent erroneous classification of output signals. It has been found that it is often necessary to adapt the levels $T_i$ to account for shifts in the data output signals. Such shifts may occur over the course of time during which the data is stored in memory matrix 10, or due to wear of the cells of memory matrix 10 due to repeated erasing, or due to external influences, such as temperature fluctuations.

FIG. 4 shows an embodiment of a threshold selection circuit. The circuit contains a counting circuit 42, and a threshold setting circuit 44. Counting circuit 42 has inputs 40 coupled to the outputs of read circuit 12 (not shown). Counting circuit 42 has outputs coupled to threshold setting circuit 44, which has outputs coupled to threshold selection lines 25a,b. In operation counting circuit 42 counts for each level "i" of the M respective detectable output levels of memory matrix 10 a number $N_i$ herein called the "digit count" that represents how many data signal outputs of memory circuit 10 read circuit 12 has detected that carry the respective level. The digit counts $N_i$ of these numbers of data signal outputs depend on the level of the threshold signals on threshold selection lines 25a,b. Threshold setting circuit 42 adapts the threshold signals until the digit counts substantially agree with required numbers $P_i$.

Encoder circuit 19 encodes received datawords from processing circuit 18 so that stored datawords stored in memory matrix 10 are of a specific type. Each stored dataword contains a plurality of N "digits" that each may take one of M levels with M>2 (M=3 for example). The stored datawords are selected from a subset of datawords wherein the numbers $P_i$ of digits that are at respective levels (indicated by the index i) in a dataword are the same for each dataword in the subset. Preferably, the numbers $P_i$ are substantially the same for different levels i (substantially equal to N/M). In the case of M=3, for example, each dataword has $P_1$ digits at a first level, $P_2$ digits at a second level and $P_3$ digits at a third level, with preferably $P_1=P_2$ and $P_2=P_3$.

Because all data words substantially have the same respective numbers $P_i$ of digits at respective levels the digit counts $N_i$ can be used by threshold selection circuit 14 to adapt the threshold signals. In an embodiment threshold selection circuit 14 adapts a threshold signal $T_i$ that distinguishes output levels that will be detected with a digit value equal to or below i from output levels that will be detected with a digit value above i. This may be implemented by counting a first sum $\Sigma N_j$ of digit counts of output signals at levels j below or equal to i defined by $T_i$ and comparing this sum with the value of the second (predetermined) sum $\Sigma P_j$ for the same levels. If the first sum $\Sigma N_j$ is higher than the second sum the level $T_i$ is increased and if the first sum is lower than the second sum the level $T_i$ is decreased. Preferably the level $T_i$ is set midway the range of $T_i$ for which the first sum assumes the value of the second. This procedure may be followed for all threshold levels.

FIG. 5 shows another example of a circuit wherein multilevel encoding may be used. This circuit contains a data source 50, an encoder 52, a transmission channel 54, a read circuit 56, an error correcting decoder 58 and a receiving circuit 59 connected in series. A threshold adjustment circuit 55 is coupled to channel 54 and read circuit 56, for adjusting the threshold levels of read circuit 56. In operation encoder 52 encodes data words from source 50 into words with digits. Each digit is transmitted over channel 54, represented by a level selected from M levels. Encoder 52 selects words so that each level occurs a respective predetermined number of times in each transmitted word. Read circuit 56 compares signals from the channel with threshold levels determined by threshold adjustment circuit 55 and outputs results of thresholding to error correcting decoder 58 for use by receiving circuit 59.

As in the case of FIG. 1 threshold adjustment circuit 55 operates to adapt the thresholds so that respective predetermined number of digits of respective values will be detected by read circuit in each word. In an embodiment read circuit 56 delays the received data of a word until threshold adjustment circuit 55 has adjusted the thresholds, but alternatively threshold adjustment circuit 55 may adjust the thresholds on the basis of results obtained for a previous word. Similar applications are possible wherein transmission channel 54 is replaced by a storage device like a magnetic recording device or an optical storage device.

It should be appreciated that the relevant words will typically be much longer in the memory embodiment of FIG. 1 than in the transmission embodiment of FIG. 5. For a small wordsize, it may be feasible to implement an encoder by means of a look up table. The word size for which the digit counts $N_i$ are counted in the memory embodiment is typically equal to the row size of the memory matrix, e.g. 256 or 1024 digits per word. The word size may even extend over a plurality of such rows that may be read in parallel from different matrices wherein the levels are expected to vary correspondingly. For such word sizes use of a lookup table is out of the question.

2. Encoding of Data Words for Multilevel Detection

FIG. 6 shows a flow-chart of an encoding process. In a first step 61 an input data word is received. This data word contains a plurality of N digits, each assuming a freely selectable one of M values (M>2).

In the process of FIG. 6, the values of selected digits in the input data words are changed so as to produce an output data word with substantially predetermined numbers $N_i$ of digits that assume respective ones of the M values (different values being indicated by the index i). The digits are changed by applying different digit maps to different groups of the digits. A digit map f: x–>y assigns to each of the M possible digit values x a respective digit value y, so that the assigned digit y differs for different digit values x. A typical example of a digit map is a map which exchanges two of the M values (say the values A and B) and leaves the other values unchanged.

In the process, the groups of digits to which different digit maps will be applied are selected so that after application of the digit maps to the digits of the selected groups substantially predetermined numbers $N_i$ of digits are realized in the output data word. Information that identifies the selected groups, and optionally also the digit maps that have been applied is then added and the combination of the output words and this information is used to encode the input data word, typically for storing the output data word with this information in memory.

In more detail, after the reception step 61, in a second step 62 a plurality of M−1 groups of digits of the received words is selected. This second step 62 will be discussed in more detail in the following. In a third step 63 the received word is transformed by application of a digit mapping operation to respective digits of a group. A fourth step 64 ensures that third step 63 is repeated for respective groups, each applying the digit mapping associated with the respective group. Once the digits of all groups have been transformed a fifth step 65 is performed producing encoded information that includes the output word produced by the third and fourth step, as well as information to identify the groups and optionally information to identify the digit mapping. "Producing encoded information" as applied by the fifth step 65 may include writing the encoded information to memory, or transmitting the encoded information.

The information that identifies the groups may take the form of index values of digits at group boundaries for example. For this purpose each digit is assigned a respective one of a series of successive index values, e.g. the sequence number of the column in memory matrix 10 where the digit is stored. Thus, groups of digits with successive index values can be identified using two index values, or even using one-index values if a group starts or ends at a predetermined index value.

It will be understood that the process of FIG. 6 may be implemented for example using a suitably programmed processor. Equivalent encoded information can also be produced by dedicated circuitry that is arranged to apply digit mapping to selected digits.

Decoder circuit 15 performs the inverse decoding operation: it retrieves the information that indicated which groups of digits need to be mapped and optionally which mapping should be applied. The information about the groups may be stored for example in memory matrix 10 and retrieved therefrom for decoding, for example as part of the data word that is read from the memory matrix 10 for decoding. Alternatively separate locations in memory matrix 10 may be used for the information or even a separate memory. Preferably the information about the groups is written with higher error protection than the data in the group, for example by using only extreme digit levels, or using a strong ECC to encode the information.

If the information about the groups is stored in the same memory matrix 10, this information is preferably encoded with predetermined numbers of digits at different levels, using a lookup table for example to convert position codes encoded position codes that have this property. However, alternatively a code that does not have predetermined numbers of digits at different levels may be used. In this case preferably the memory cells that store this information do not contribute to the determination of the threshold level. However, it may even be accepted that these memory cells do contribute to the determination of the threshold level, because the number of memory cells necessary to store this information is only small compared to the number of memory cells needed to store the user data.

Group selection step 62 of FIG. 6 can be implemented in many ways. A simple solution will be illustrated for the case where M=3, so that there are three possible digit values, which will be called A, B, C that will be represented by different nominal signal levels during storage or transmission. In this example M−1=2 digit maps are selected, e.g. a first digit map which maps an A digit to a B digit, maps a B digit to an A digit and leaves a C digit unchanged and a second digit map which leaves an A digit unchanged, maps a B digit to a C digit and maps a C digit to a B digit. Application of the first digit map to any number of digits in the data word leaves the number $N_C$ of digits with digit value C unchanged. Application of the second digit map to any number of digits in the data word leaves the number $N_A$ of digits with digit value A unchanged.

This makes it possible to select the groups of digits from the data word to which the digit maps will be applied in two steps. In a first step a first group is selected to which the first map will be applied and in the second step a second group is selected to which the second map will be applied.

In the first step, the first group is selected so that after application of the first map to the digits of the first group the digit count $N_A$ (of digits in the transformed data word that have the value A) has the value $P_A$ that is required for the output word. This value is not affected by the group selected in the second step, because the second map does not affect $N_A$. In the second step the second group is selected so that after application of the second map to the digits of the second group the digit count $N_B$ has the value $P_B$ that is required for the output word (and therefore also the digit count $N_C$ has its required value).

In the first step the first group is selected for example by counting the digit count $N_A$ in the input data word and counting a running difference $n_A-n_B$ (the difference between the number of digits that have value A and the number of digits that have value B) when a proposed first group is successively expanded by adding digits. Once $n_A-n_B$ assumes the value $N_A-P_A$ the required first group has been found. The second group may be constructed in a similar way by expanding the group until a running difference $n_B-n_B$ equals $N_B'-P_B$ ($N_B'$ being the digit count of digits at level B obtained after application of the first mapping to the first group $N_B'=N_B+N_A-P_A$).

When the digit mapping is applied to successively larger groups the digit count of digits that have digit value $N_A$ changes. It is ensured that $N_A$ may change to the original value of $N_B$ (if all A's and B's are exchanged). Therefore it is ensured that the required groups can be found if $N_A<P_A<N_B$ or $N_B<P_A<N_A$ (of course if $N_A=P_A$ at the outset an empty first group may be used). Preferably the levels A, B and C that are involved in encoding are preferably selected so that this condition is met. However, it may be noted that $N_A$ can often change to values outside the range $N_A$ to $N_B$ so that it may not be necessary to make such a selection of A, B and C, especially if large data words are used.

FIG. 7 shows a flowchart of a process for group selection step 62 to select groups of digits in an input data word according to this method when the number of levels M with which the data word is encoded equals three. The process is applied to an input word with N digits, numbered 1. N where each digit may have one of M=3 values. The problem is to find groups so that a transformed output word is realized wherein each value is assumed the same number of times N/3.

In a first step 71 the digit counts $N_1$, $N_2$, $N_3$ of digits with respective values in the input data word are counted. For example, if the input data word is 11232 11223 11311

Then $N_1=7$, $N_2=4$ and $N_3=3$. It should be appreciated that the overall length of the data word (15 digits) is only used for the purpose of the example: in practice much longer words (e.g. 255 digits or more) will be used. In a second step 72 levels A and B are selected so that $N_A<P_A<N_B$. In the example B=1 and A=2 may be selected for example, so that the input word corresponds to

BBACA BBAAC BBCBB

Also in second step 72 a group G1 of digits is defined and initialized to an empty group. A running difference $n_A-n_B$ is defined and set to zero. An initial digit counter "i" is set to zero. In a third step 73 it is tested whether $N_A-(n_A-n_B)=N/3$. If not, in a fourth step 74 the digit counter is increased and the group G1 is expanded by adding the digit indicated by the digit counter. The running difference $n_A-n_B$ is updated dependent on whether the added digit has the value A, B or C. Subsequently the process returns to the third step 73.

In the example, the group G1 first contains the first digit, which has the value B, so that $(n_A-n_B)$ becomes −1. Now $N_A-(n_A-n_B)=5$, so that a desired group has been found, which corresponds to the mapping of the data word to

ABACA BBAAC BBCBB

When the third step 73 finds that $N_A-(n_A-n_B)=N/3$, a fifth step 75 is executed, wherein a group G2 of digits is defined and initialized to an empty group, a running difference $n_B-n_C$ is defined and set to zero and the initial digit counter "i" is set to zero. Subsequently a sixth step 76 is executed wherein it is tested whether $N_B'-(n_B-n_C)=N/3$. If not, in a seventh step 77 the digit counter is increased and the group G2 is expanded by adding the digit indicated by the digit counter. The running difference $n_B-n_C$ is updated dependent on whether the added digit has the value A, B or C. Subsequently the process returns to the sixth step 76. In the example this results in a data word

ACABA CCAAC BBCBB=23212 33223 11311

Once sixth step 76 finds that $N_B-(n_B-n_c)=N/3$ the required groups have been found and the remainder of the process of FIG. 6 may be executed, supplying the modified data word and for example the index values 1 and 7 of the last digits in the groups G1 and G2, as well as an identification of the digits A, B and C, as information to identify the mappings that have been used for encoding (a predetermined digit value may be used for digit A for example, leaving only the selection of digit value B dependent on the data word, so that only this digit value needs to be encoded).

It may be noted that it is not necessary that the groups G1 and G2 that have been determined according to the flow chart of FIG. 7 are used directly in the process of FIG. 6. For example, typically there will be digits that belong to both groups G1 and G2, digits that belong to one group (G1 or G2, whichever is larger) and digits that belong to no group. In one embodiment both the first and second digit mapping are applied to the digits that belong to both groups. However, application of both digit mappings may be implemented by a single composite mapping (changing digits values A to C, digit values B to A and digit values C to B). In this case such a composite mapping is applied to the smaller of the two groups G1, G2 and the first or second mapping is applied to the digits that belong to the larger of the groups but not to the other group.

It should be appreciated that the process of FIG. 7 can readily be expanded to the case where a larger number of levels M is used to encode digits. This may be realized for example by recursively successive digit mappings wherein two digit values are exchanged. In general an algorithm of the following form may be used:

1. Check if all digit counts are equal to their desired number. If so, stop terminating the algorithm
2. Find a digit value A who's digit count $N_A$ is smaller than its required value $P_A$
3. Find a digit value B who's digit count $N_B$ is larger than its required value $P_B$
4. Start swapping digit values A and B for successive digits, until the digit count $N_A$ for A is equal to its required value $P_A$.
5. Encode which symbols A and B were swapped, and the positions of the digits that were swapped in this iteration
6. Repeat from step 1

FIG. 7a illustrates this algorithm. A step 78 tests whether there are remaining digit values that need to be mapped to achieve the required digit counts. This step is executed when in third step 73 it has been determined that a group G1 has been found so that $N_A$ is changed to the desired value. Once step 78 determines that a next digit value should be processed, steps similar to the second to fourth steps of FIG. 7 are used for other digit values, the last digit value that played the role of B for example playing the role previously played by the digit value A. First in the modified second step 72 it is determined whether the new $N_A$ is above or below its desired value P after the previous mapping, and subsequently a new (as yet unchanged) digit value B is selected whose $N_B$ is below or above the desired value P when $N_A$ is above or below its desired value respectively.

As will be appreciated in this technique successive groups $G_i$ are selected, each for a digit mapping $F_i$ wherein a pair of digit values $A_i$, $B_i$ is exchanged. In an embodiment the digit mappings form a chain, wherein each mapping changes a digit value $A_i=B_{i-1}$ involved as a digit value $B_{i-1}$ in its predecessor mapping $F_{i-1}$ to a new digit value $B_i$ and vice versa ($B_i->A_i$). The use of a chain simplifies the administration of the algorithm but is not strictly necessary. The count of digits $N_{Ai}$ for an increasingly larger number of digit values $A_i$ (i=, ... ) is thus set to the desired value.

More generally, the following algorithm may be used:

For example, if M=5 (five different digit values) the input data word may be for example 14435 22214 31122 $N_1=4, N_2=5, N_3=2, N_4=3, N_5=1$ Now a chain $(A_1=2, B_1=3)$, $(A_1=3, B_1=4)$ $(A_1=4, B_1=5)$ $(A_1=5, B_1=1)$ may be used, corresponding to successively mapped words 14425 33314 31122 mapped up to eight digit position; now $N_2=3$ 13325 44414 31122 mapped up to eight digit position; now $N_3=3$ 13324 55414 31122 mapped up to seventh digit position; now $N_4=3$ 53324 55414 31122 mapped up to first digit position It should be appreciated that it is not necessary to cycle through the flow chart of FIG. 7a for successive digit values.

The chain of digit value pairs and digit mappings may be selected in advance, before the groups of digits $G_i$ that are mapped are selected. This makes it possible to determine in one cycle the digit positions where all groups end. Initially, during this cycle a digit map F is used that is a composition $F_1$ $F_2$ . . . of the digit maps $F_1$, $F_2$ of the original cycles. This composite digit map performs a cyclic permutation of digit values. Next it is determined how the digit counts will change if this composite map is applied to an increasingly larger group of digits. Once this group has become so large that in the cyclic execution of FIG. 7a the group of digits for a mapping $F_i$ would be complete, this map is removed from the composite map.

In the preceding example: initially a composite digit map (3−>2, 2−>1, 1−>5, 5−>4, 4−>3) is applied, which is the result of application of the successive maps (2<−>3, 3<−>4, 4<−>5 and 5<−>1). After the first digit position has been reached this map will be replaced by (3−>2, 2−>5, 5−>4, 4−>3), which is the result of application of the successive maps (2<−>3, 3<−>4 and 4<−>5). After the seventh digit position is reached this map will be replaced by (3−>2, 2−>4, 4−>3), which is the result of application of the successive maps (2<−>3 and 3<−>4). After the eight digit position no more transformation is needed. The digit positions where the composite maps are changed, and the changes applied to the maps can be computed by means of the criteria used for the embodiment of FIG. 7a, coupled with the knowledge that in the case of FIG. 7a each digit map will be applied until the digit count of the first one of the exchanged digit values has reached the required digit count. Of course these criteria may be rephrased so that the positions and map changes can be computed directly.

As a result, the data word successively changes from 14435 22214 31122 input data word 54435 22214 31122 mapped with (3−>2, 2−>1, 1−>5, 5−>4, 4−>3)

53435 22214 31122 mapped with (3−>2, 2−>5, 5−>4, 4−>3)

53335 22214 31122 mapped with (3−>2, 2−>5, 5−>4, 4−>3)

53325 22214 31122 mapped with (3−>2, 2−>5, 5−>4, 4−>3)

53324 22214 31122 mapped with (3−>2, 2−>5, 5−>4, 4−>3)

53324 52214 31122 mapped with (3−>2, 2−>5, 5−>4, 4−>3)

53324 55214 31122 mapped with (3−>2, 2−>5, 5−>4, 4−>3)

53324 55414 31122 mapped with (3−>2, 2−>4, 4−>3)

It should be appreciated that in the preceding only some examples were given of how a larger number of levels can be handled.

FIG. 8 shows a flow chart of an alternative process for ensuring that desired counts P of digits values occur in a data word. In a first step 81, the digit values are divided into two sets of digit values. The digit count of digits $N_I$ in the input data word that have values in the first set is counted. In a second step 82 a digit mapping is chosen that maps exchanges one or more digit values from one set with respective digit values from the other set. In a third step 83 a group G of digit is initialized to an empty group, the digit counter is initialized and a running difference $n_I-n_{II}$ is set to zero. In a fourth step 84 it is tested whether $N_I-(n_I-n_{II})$ equals the desired count of digit values in the first set (i.e. the sum of the digit counts for the digit values in the first set). If not, a fifth step 85 is executed wherein the digit counter is increased, the group G is expanded with the digit indicated by the digit counter and the running difference is updated, dependent on whether this digit belongs to the first or second group. After this the process repeats from the fourth step 84.

Once fourth step 84 detects that the required group G has been found, it is known that, after applying the selected digit mapping to the digits in the first group, for each set the sum of the digit counts $N_i$ of the digit values in the set will assume a desired value (the sum of the desired digit counts $P_i$ for the digit values in the set). Now any suitable process (e.g. the process of FIG. 8 itself) may be applied within the sets to find groups to realize the desired digit counts P. As will appreciated the size of the sets that need to be considered may successively be halved in this way, and the halved sets may be handled in parallel.

The process described with reference to FIG. 7 is an example of the process of FIG. 8. In the case of FIG. 7 the sets where a first set including digit value A and a second set including digit values B and C. In the first four steps, a group G1 was selected to ensure that the sums of the digit counts for the respective sets assumed the desired values. After that no first action is needed for the first set, since it contained only one digit value (A). One further group selection is needed for the second set of digit values (B and C), which is performed in the fifth and following steps of FIG. 7.

In the example where M=5 and the input data word is 14435 22214 31122

The sets of digit values (1, 2, 3) and (4, 5) may be selected, so that $N_I$=11 and $N_{II}$=4. An first map (2<−>5) may be used (any mappings within the sets may be added). In this way a group containing the first eight digits will be selected, so that the input word will be mapped to 14432 55514 31122

Herein the first sum of the digit counts for the values 1, 2 and 3 and the second sum for the digits 4 and 5 have the desired values (9 and 6). Now respective intra set mappings may be applied to correct the digit counts within the sets.

Preferably, the digit mapping is selected in second step 82 so that it is ensured that a required group G can be found. For each possible mapping an ensured range of change in the digit counts can be determined by computing the effect if the mapping is applied to the data word as a whole. A difference $S_I-S_{II}$, of a first and second sum $S_I$ and $S_{II}$, determines the ensured range of change. The first sum $S_I$ is a sum of the digit counts for digit values that are mapped from the first set to the second set and the second sum $S_{II}$, is a sum of digit counts for digit values that are mapped the other way around.

This means that it is ensured that any digit count in the range $N_I$ to $N_I-(S_I-S_{II})$ can be realized for the first set by applying the digit map to part of the data word. To ensure that a desired digit count is realized the desired value $P_I$ of this count (i.e. the sum of the desired digit counts $P_i$ for the digit values in the first set) preferably lies within this range. Preferably a digit map is selected that satisfies this condition. Alternatively, once a digit map has been selected, sets may be selected that satisfy this condition.

As another example highly symmetric mappings may be used, selected so that the order of application of the mapping does not affect the result. For example, if M=4 respective digit mappings (A<->C+B<->D) and (A<->B) and (C<->D) may be used. If digit values A=1, B=2, C=3, D=4 are selected this results in the following transformation of the word 1141 3334 2222 3334 initial word=AADA CCCD
BBBB CCCD 3323 1112 4444 1114 after application of (A<->C+ B<->D until $N_A+N_B=N_C+N_D$)

3313 2222 4444 1114 after application of A<->B until that $N_A=N_B$ 4414 2222 3333 1114 after application of C<->D until $N_C=N_D$:

Note that this scheme is independent of the order of application of the digit mappings, so it is not necessary encode information about the order. Decoding order can be different from encoding order. This technique is not limited to the digit mappings shown e.g. mappings A<->D+B<->C; A<->B; C<->D and several others have the same properties.

FIG. 9 shows an encoding circuit for use in the application of the described method. The circuit contains a shift register 90, a digit mapping circuit 92, a map selector 94, a counting circuit 96 and an output register 98. In operation the original digits of a data word that has to be encoded are loaded into shift register 90 (e.g. serially or in parallel). Shift register 90 supplies digits from the data word successively to digit mapping circuit 92. Digit mapping circuit 92 maps each digit value to an output digit value according to a selectable map. Digit mapping circuit 92 is implemented for example as a lookup table memory that stores output digit values at addresses corresponding to input digit values. Counting circuit 96 counts the number of digits with specific digit values. When a specified combination of count values is reached, as described with respect to the flow charts of the preceding figures, counting circuit 96 triggers map selector 94 to change the digit map that is applied by digit mapping circuit as described for the preceding figures, e.g. to an identity map. Optionally the mapped digit values are fed back to shift register 90 for another digit mapping iteration. It should be appreciated, however, that without deviating from the invention other circuits may be used than the circuit of FIG. 9. For example, a programmable processor may be used, which is programmed to perform equivalent operations.

According to the invention data words are encoded by mapping respective groups of digits from input data words according to respective maps and by adding information that represents the groups and optionally the maps to encode the word. During decoding the information about the groups is used to apply the inverse maps. Mapping is used to ensure that predetermined digit counts occur in the encoded words, which facilitates the selection of threshold levels for distinguishing different digit values.

However, it should be appreciated that this is merely one application of the invention. Other applications are possible.

For example, when the data word is very large, it does not necessarily matter whether the digit counts for the various digit values are exactly equal to a predetermined values in each word. Threshold selection techniques are available that are not affected by minor variations around the desired values of the digit counts. In other words, it may suffice to specify constraints in the form that a digit count $N_i$ should lie in an interval between a minimum $P_i^{min}$ and a maximum $P_i^{max}$ so that the search for a group can be completed once the digit count $N_i$ of a mapped word is within such an interval. This can be used to reduce the search time for the groups, e.g. by expanding the groups by more than one digit at a time during the search. This also reduce the amount information that is needed to represent the groups. Hence, it suffices that groups are found that make the digit counts approximate the desired values sufficiently closely to enable threshold selection. Dependent on the threshold selection techniques digit counts within one or two percent of the number of digits in a data word may suffice for example.

As another example, examples have been given for the case where all desired digit counts are equal to each other (N/M, N being the number of digits in the data word and M being the number of digit values). Using equal values has the advantage that a maximum number of different data word values can be encoded with a minimum of digits. However it should be appreciated that alternatively different desired values may be used of different digits. In fact, dependent on the threshold selection technique it may not even be necessary to specify desired values. It may suffice to specify constraints expressed for example conditions on a weighted sum: $sum_i\ w_i\ N_i=C$, ($sum_i$ denoting a sum of the following term for different values of i) wherein predetermined weight factors $w_i$ are used, or even in terms of inequalities like $sum_i w_i N_i<C$. The technique of FIG. 8 provides an example wherein constraints on of sums of digit counts for sets of digits are specified. As another example, the only constraint may be that the sums of digit counts for successive pairs of digit values should have predetermined values, no constraints being imposed on the digit counts in the pair because the threshold between the digits in the pair is derived from other threshold. The described techniques can easily be adapted to satisfy such constraints.

Furthermore, although the invention has been described by means of examples wherein the groups of digits G to which the same mapping is applied all start with the same digit, and include digits with increasing indices, it will be understood that without deviating from the invention other groups may be used. Some groups may start at the digit with the highest index for example, these groups being expanded by adding digits with lower index values. Groups may start at other digits and may be expanded by adding digits with higher and lower indices. Similarly, the groups need nod be constructed by adding one digit at a time. As an alternative, for example groups may be grown by choosing whether or not to add subgroups of digits of varying sizes, for example dependent on the size of the deviation from the desired digit count. As an alternative a starting group may contain a large number of digits and a group that leads to a desired digit count may be constructed by successively leaving out digits. Any form of groups may be used.

Furthermore, although the invention has been described for the case wherein all data words have to satisfy the same conditions, it will be understood that, without deviating from the invention different data words may be required to satisfy different conditions. This is the case for example when the thresholds will be selected differently for different data words (for example dependent on the address of the word, e.g. using one threshold selection scheme for words with even addresses and another scheme for words with odd addresses). In this case, different selection criteria will be used for selecting groups in different words.

The invention claimed is:

1. A data processing circuit, comprising an encoder circuit for encoding an input data word that comprises a plurality of digits wherein each digit has a value selected from at least three available digit values for controlling a signal level in multi-level encoding scheme that uses more than two levels, the encoder circuit being arranged to define at least two digit maps, each digit map defining assignments of each of the available digit values to a respective output digit value, each digit map mapping to a common set of output digit values;

select at least two groups of digits within the input data word, each group associated with a respective one of the digit maps, the groups being selected under a constraint that each digit map has been applied selectively to the digits from its associated group, digit counts of the number of times respective digit values, which occur in the data word wherein the data word will satisfy predetermined criteria;

generate a data signal that represents the input data word by information that identifies the selected groups and an output data word obtained by mapping the digits of each group in the input data word according to the digit map for that group.

2. A data processing circuit according to claim 1, comprising a memory with memory cells for storing greater than two-level encoded information, each digit of the output data word being stored in a respective one of the memory cells.

3. A data processing circuit according to claim 2, comprising
a detector circuit arranged to detect the digit values of the output data word represented by comparing signals from respective ones of the memory cells each with at least two different threshold levels,
a threshold level selection circuit arranged to select the threshold levels so that the criteria are met for the detected digit values for the output data word.

4. A data processing circuit according to claim 1, wherein said criteria impose that digit counts for individual digit values and/or sums of digit counts for sets of digit values lie within respective predetermined ranges of digit count values that contain at least one digit count value.

5. A data processing circuit according to claim 1, the encoder circuit being arranged to
define a sequence of the criteria;
select the digit maps in association with the criteria, so that application of the digit map that is associated with a particular criterion does not change whether the criteria associated with groups that precede the particular criterion in the sequence are satisfied;
change the content of successive groups in the sequence successively, each group being changed until, when the digit map associated with the group has been applied selectively to the digits from the group, the digit counts meet the criterion associated with the digit map.

6. A data processing circuit according to claim 5, wherein the digit maps associated with successive criteria in the sequence each involve exchanging a respective pair of digit values, the remaining digit values remaining unchanged.

7. A data processing circuit according to claim 5, wherein the sequence of the criteria and/or the digit maps associated with the criteria are selected so that, for each particular criterion in the sequence, after application of the digit maps associated with the preceding criteria in the sequence, there exists at least one digit count for which the particular criterion is satisfied in a range of digit counts from a first digit count before application of the digit map associated with the particular criterion to a second digit count after a hypothetical application of the digit map associated with the particular criterion to all digits in the word.

8. A data processing circuit according to claim 5 wherein the data signal that represents the information that represents the input data word includes information that identifies the digit maps.

9. A data processing circuit according to claim 5, comprising an output circuit connected to a transmission channel, the output circuit being arranged to transmit the digits of the output data word as greater than two- level encoded information.

10. A method of encoding an input data word that comprises a plurality of digits wherein each digit has a value selected from at least three available digit values for controlling a signal level in a multi- level encoding scheme that uses more than two levels, the method comprising
receiving the input data word;
defining at least two digit maps, each digit map defining assignments of each of the available digit values to a respective different output digit value, each digit map mapping to a common set of outputs digit values;
selecting at least two groups of digits within the input data word, each group associated with a respective one of the digit maps, the groups being selected under a constraint that digit counts of the number of times respective digit values, which occur in the data word wherein in the data word will satisfy predetermined criteria;
generating a data signal that represents the input data word by information that identifies the selected groups and an output data word obtained by mapping the digits of each group in the input data word according to the digit map for that group.

11. A method of encoding according to claim 10, wherein the criteria impose that digit counts for individual digit values and/or sums of digit counts for sets of digit values lie within respective predetermined ranges that contain at least one value.

12. A method of encoding according to claim 10, the method comprising
defining a sequence of the criteria;
selecting the digit maps in association with the criteria, so that application of the digit map that is associated with a particular criterion does not change whether the criteria associated with groups that precede the particular criterion in the sequence are satisfied;
changing the content of successive groups in the sequence successively, each group being changed until, when the digit map associated with the group has been applied selectively to the digits from the group, the digit counts meet the criterion associated with the digit map.

13. A method of encoding according to claim 12, wherein the digit maps associated with successive criteria in the sequence each involve exchanging a respective pair of digit values.

14. A method of encoding according to claim 12, wherein the sequence of the criteria and/or the digit maps associated with the criteria are selected so that, for each particular criterion in the sequence, after application of the digit maps associated with the preceding criteria in the sequence, there exists at least one digit count for which the particular criterion is satisfied in a range of digit counts from a first digit count before application of the digit map associated with the particular criterion to a second digit count after a hypothetical application of the digit map associated with the particular criterion to all digits in the word.

15. A method of encoding according to claim 10, wherein the data signal that represents the information that represents the input data word includes information that identifies the digit maps.

16. A method of encoding according to claim 10, comprising detecting the digit values of the output data word represented by the data signal by comparing the data signal with at least two different threshold levels, the threshold levels being selected so that the criteria are met for the detected digit values.

17. A method of encoding according to claim 10, wherein the data signal is stored in a memory, the digits of the data word being stored in respective memory cells at a common address, as greater than two- level encoded information.

18. A method of encoding according to claim 10, wherein the data signal is transmitted via a transmission channel, the digits of the data word being transmitted as greater than two-level encoded information.

* * * * *